United States Patent
Kasashima et al.

(10) Patent No.: US 9,924,589 B2
(45) Date of Patent: Mar. 20, 2018

(54) CIRCUIT BOARD

(71) Applicants: Masato Kasashima, Gifu (JP);
Tomoyoshi Kobayashi, Aichi (JP);
Satoru Sasaki, Aichi (JP); Yoshihiro Ikushima, Aichi (JP)

(72) Inventors: Masato Kasashima, Gifu (JP);
Tomoyoshi Kobayashi, Aichi (JP);
Satoru Sasaki, Aichi (JP); Yoshihiro Ikushima, Aichi (JP)

(73) Assignee: OMRON AUTOMOTIVE ELECTRONICS CO., LTD., Aichi (JP)

( * ) Notice: Subject to any disclaimer, the term of this patent is extended or adjusted under 35 U.S.C. 154(b) by 57 days.

(21) Appl. No.: 14/980,395

(22) Filed: Dec. 28, 2015

(65) Prior Publication Data
US 2016/0192473 A1    Jun. 30, 2016

(30) Foreign Application Priority Data

Dec. 26, 2014    (JP) ................... 2014-263912
Jun. 15, 2015    (JP) ................... 2015-120488

(51) Int. Cl.
*H05K 1/02*    (2006.01)
*H05K 1/11*    (2006.01)
(Continued)

(52) U.S. Cl.
CPC ......... *H05K 1/0204* (2013.01); *H05K 3/0061* (2013.01); *H05K 3/4697* (2013.01);
(Continued)

(58) Field of Classification Search
CPC ............... H05K 1/0204; H05K 3/0061; H05K 2201/10416; H05K 2201/10409; H05K 3/4697
See application file for complete search history.

(56) References Cited

U.S. PATENT DOCUMENTS 5,305,186 A     4/1994   Appelt et al.
7,309,838 B2 *  12/2007  Noguchi ............. H01L 23/3672
                                                    174/255
(Continued)

FOREIGN PATENT DOCUMENTS

JP    H06-244303 A    9/1994
JP    H08-228052 A    9/1996
(Continued)

OTHER PUBLICATIONS

Office Action issued in corresponding Japanese Application No. 2015-120488, dated Dec. 5, 2017 (7 pages).

*Primary Examiner* — Robert J Hoffberg
*Assistant Examiner* — Matt Dhillon
(74) *Attorney, Agent, or Firm* — Osha Liang LLP; Thomas K. Scherer

(57) ABSTRACT

A circuit board includes a first insulating layer having an upper surface on which mounting regions of electronic components and wiring patterns are provided, a metal core provided on the lower surface of the first insulating layer, in such a way as to vertically overlap with the mounting regions, and a second insulating layer provided on the lower surface of the first insulating layer, around the metal core. The lower surface of the metal core is exposed from the second insulating layer, the thermal conductivities of the first insulating layer and the metal core are higher than the thermal conductivity of the second insulating layer, and the hardness of the first insulating layer is higher than the hardness of the second insulating layer. Through holes that penetrate the insulating layers and that connect wiring patterns of the insulating layers are provided.

9 Claims, 6 Drawing Sheets

(51) Int. Cl.
 *H05K 3/00* (2006.01)
 *H05K 3/46* (2006.01)
(52) U.S. Cl.
 CPC .............. *H05K 2201/10409* (2013.01); *H05K 2201/10416* (2013.01)

(56) References Cited

U.S. PATENT DOCUMENTS

| | | | |
|---|---|---|---|
| 8,378,229 B2 * | 2/2013 | Nakasato | H01L 21/486 174/262 |
| 9,497,853 B2 * | 11/2016 | Lee | H05K 3/4647 |
| 2001/0026441 A1 * | 10/2001 | Nakamura | H01L 23/3677 361/720 |
| 2003/0058630 A1 * | 3/2003 | Takano | H01L 23/10 361/783 |
| 2006/0023432 A1 | 2/2006 | Hockel et al. | |
| 2009/0038826 A1 * | 2/2009 | Lee | H05K 1/0206 174/252 |
| 2011/0316035 A1 | 12/2011 | Shin et al. | |
| 2013/0092421 A1 * | 4/2013 | Kajiya | H05K 1/0206 174/252 |
| 2013/0347051 A1 * | 12/2013 | Bose | H04N 21/418 725/151 |
| 2014/0217608 A1 * | 8/2014 | Takayama | H05K 3/32 257/774 |
| 2014/0268780 A1 * | 9/2014 | Wang | F21V 19/003 362/249.06 |
| 2015/0146379 A1 * | 5/2015 | Katz | H05K 1/0204 361/707 |
| 2016/0150642 A1 * | 5/2016 | Kajita | H05K 1/115 361/783 |

FOREIGN PATENT DOCUMENTS

| | | |
|---|---|---|
| JP | 2006-049887 A | 2/2006 |
| JP | 2007-036050 A | 2/2007 |
| JP | 2008-251671 A | 10/2008 |
| JP | 2009-021468 A | 1/2009 |
| JP | 2012-009801 A | 1/2012 |
| JP | 2012-119607 A | 6/2012 |
| JP | 2014-036033 A | 2/2014 |
| JP | 2014-099544 A | 5/2014 |
| JP | 2014-157949 A | 8/2014 |
| JP | 2014-179415 A | 9/2014 |
| JP | 2014-179416 A | 9/2014 |

* cited by examiner

<Upper surface layer L1>

<Inner layers L2, L3, L4>

<Lower surface layer L5>

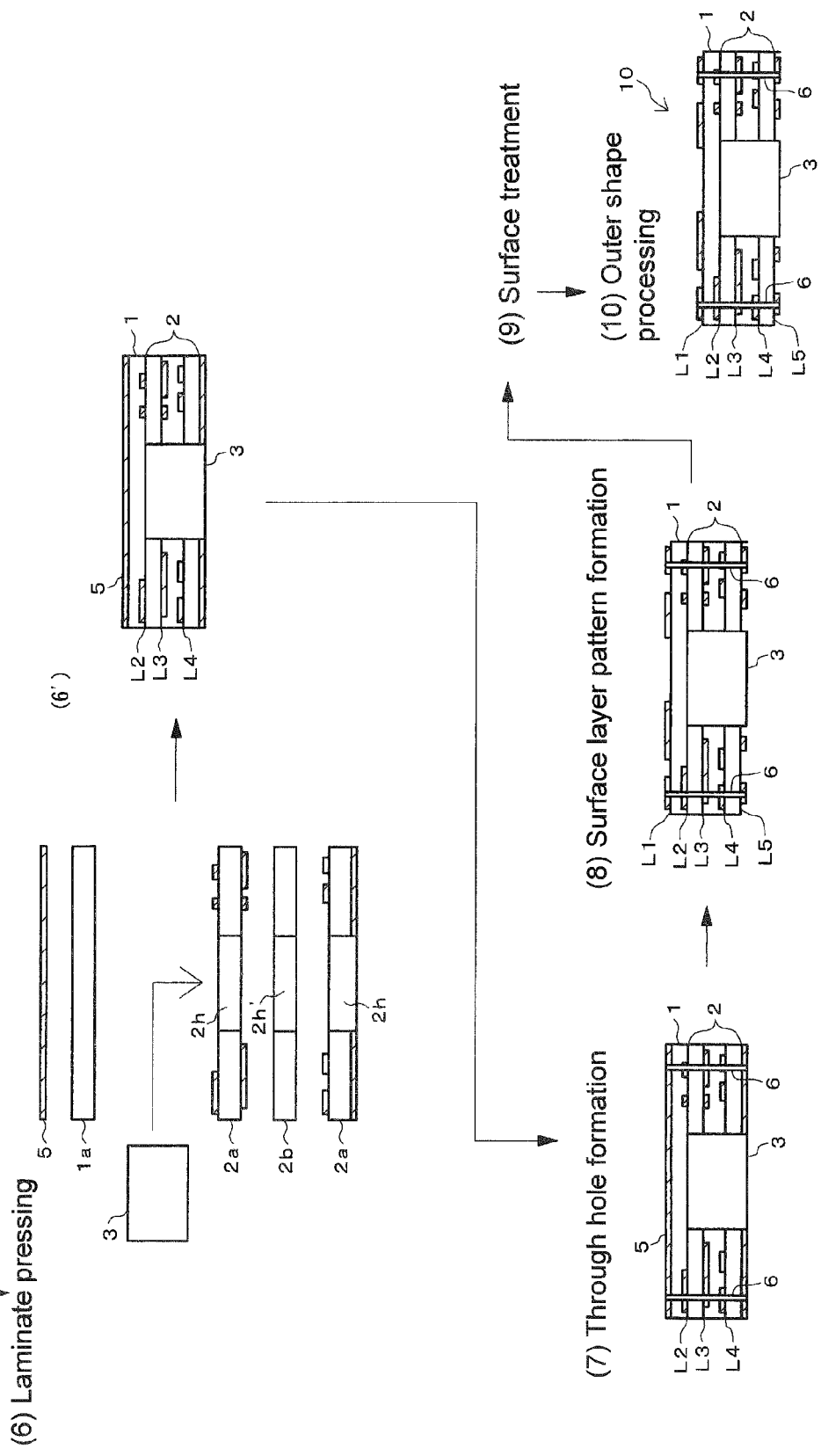

<Upper surface layer L1>

CIRCUIT BOARD

CROSS-REFERENCE TO RELATED APPLICATION

This application is based on Japanese Patent Application No. 2014-263912 filed with the Japan Patent Office on Dec. 26, 2014, and Japanese Patent Application No. 2015-120488 filed with the Japan Patent Office on Jun. 15, 2015, the entire contents of which are incorporated herein by reference.

FIELD

The disclosure relates to a structure of a circuit board on which electronic components are mounted, the structure being for radiating heat generated by the electronic components.

BACKGROUND

Various structures for radiating heat generated by electronic components have been proposed with respect to circuit boards having electronic components mounted, and a wiring pattern formed, on the upper surface of an insulating layer.

For example, according to circuit boards of JP 2007-36050 A, JP 2014-179416 A, JP 2014-179415 A, JP 2012-119607 A, JP 2006-49887 A, JP 2008-251671 A, JP 2014-157949 A, and JP 6 (1994)-244303 A, a thermal conductor made of a metal such as copper is embedded in an insulating layer, and an electronic component that generates heat is mounted above the thermal conductor.

According to JP 2007-36050 A and JP 2008-251671 A, a conductor such as a land or a solder is provided on the upper surface of the thermal conductor, and an electronic component is mounted on the conductor. According to JP 2014-179416 A, JP 2014-179415 A, JP 2014-157949 A, and JP 6 (1994)-244303 A, an insulating layer is provided on the upper surface of the thermal conductor, and an electronic component is mounted on the upper surface of the insulating layer via a conductor. In JP 2014-179416 A, JP 2014-179415 A, and JP 2014-157949 A, the material of the insulating layer on the upper surface of the thermal conductor and the material of an insulating layer around (on the lateral side) of the thermal conductor are the same. Also, according to JP 2014-179416 A and JP 2014-179415 A, the insulating layer has a high thermal conductivity. According to JP 6 (1994)-244303 A, the insulating layer on the upper surface of the thermal conductor is thermally enhanced and reinforced by using, as the material of the insulating layer, glass or polymer fiber reinforcement impregnated with a high thermal conductivity additive (zinc oxide, aluminum oxide, aluminum nitride, etc.). According to JP 2012-119607 A and JP 2006-49887 A, the main body of the electronic component (the package portion of a semiconductor) is mounted on the upper surface of the thermal conductor via a thermal conductive member. Also, the thermal conductive member of JP 2006-49887 A has insulation properties.

Moreover, according to JP 2007-36050 A, an insulating layer is provided on the lower surface of the thermal conductor, and a heat radiator is attached on the lower surface of the insulating layer. According to JP 2014-179416 A, JP 2014-179415 A, JP 2012-119607 A, and JP 6 (1994)-244303 A, the lower surface of the thermal conductor is exposed from the insulating layer. Also, JP 2014-179416 A discloses an example where a conductor or an insulating layer with high thermal conductivity is provided on the lower surface of the thermal conductor and the lower surface of the insulating layer around the thermal conductor. JP 2012-119607 A discloses an example where a heat radiator is screwed to the lower surface of the thermal conductor.

According to JP 2006-49887 A, a copper layer is provided on the lower surface of the insulating layer around the thermal conductor, the copper layer and the thermal conductor are connected, and the lower surface of the thermal conductor is exposed from the copper layer. Also, JP 2006-49887 A discloses an example where a heat radiator is provided on the lower surface of the thermal conductor and the lower surface of the copper layer via an insulating layer with high thermal conductivity. According to JP 2008-251671 A and JP 2014-157949 A, an insulating layer is provided on the lower surface of the thermal conductor and the lower surface of the insulating layer around the thermal conductor, and a metal layer for heat radiation is provided on the lower surface of the insulating layer. Moreover, according to JP 2008-251671 A, the insulating layer that is in contact with the metal layer has a high thermal conductivity.

In a case where a thermal conductor is embedded in an insulating layer of a circuit board, and an electronic component is mounted on the upper surface of the thermal conductor, as in a conventional case, heat that is generated by the electronic component is directly transferred to the thermal conductor, and is radiated below the thermal conductor. However, since the electronic component and the thermal conductor are electrically connected, it is difficult to mount other electronic components in the vicinity. Moreover, there are problems that it is hard to form an electrical circuit on the circuit board, and that the mounting density of the circuit board is reduced.

On the other hand, in the case where an electronic component is mounted on the upper surface of the thermal conductor via the insulating layer, heat generated by the electronic component is not easily transferred to the thermal conductor, and the efficiency of heat radiation to below the thermal conductor is reduced.

Furthermore, if the insulating layer is formed using a material impregnated with a high thermal conductive additive, the thermal conductivity of the insulating layer is increased, but the hardness of the insulating layer is also increased due to the mixing of the additive. Accordingly, for example, even if a through hole is to be provided to a multi-layer circuit board where wiring patterns are provided on the upper and lower surfaces and inside the insulating layer in order to connect the plurality of wiring patterns at different layers for the purpose of increasing the degree of freedom regarding the circuit configuration, it is difficult to form the through hole in such away as to penetrate the hard insulating layer.

SUMMARY

Objects of one or more embodiments of the disclosure are to facilitate mounting of an electronic component on a circuit board, to efficiently radiate heat that is generated by the electronic component, and to allow a through hole to be easily formed to the circuit board.

A circuit board according to one or more embodiments of the disclosure includes a first insulating layer having an upper surface on which a mounting region of an electronic component and a wiring pattern are provided, a thermal conductor provided on a lower surface of the first insulating layer, in such a way as to vertically overlap with at least the mounting region, and a second insulating layer provided on the lower surface of the first insulating layer, around the thermal conductor. Also, a lower surface of the thermal conductor is exposed from the second insulating layer, thermal conductivities of the first insulating layer and the thermal conductor are higher than a thermal conductivity of the second insulating layer, hardness of the first insulating layer is higher than hardness of the second insulating layer, and a through hole penetrating the first insulating layer and the second insulating layer is further included.

According to one or more embodiments of the disclosure, since the first insulating layer is provided on the upper surfaces of the thermal conductor and the second insulating layer, one or more electronic components may be easily mounted above the thermal conductor while being insulated from the thermal conductor. Also, the wiring pattern may be easily formed above the thermal conductor while being insulated from the thermal conductor. Accordingly, an electrical circuit may be easily formed on the upper surface of the circuit board, and the mounting density of the circuit board may be increased. Also, since the thermal conductivities of the first insulating layer and the thermal conductor are higher than the thermal conductivity of the second insulating layer, heat generated by an electronic component that is mounted above the thermal conductor may be easily transferred to the thermal conductor via the first insulating layer, and be efficiently radiated to outside from the lower surface of the thermal conductor that is exposed from the second insulating layer. Moreover, by making the thermal conductivity of the first insulating layer higher than the thermal conductivity of the second insulating layer, even if the hardness of the first insulating layer is higher than the hardness of the second insulating layer, only the first insulating layer at the top is hardened, not the entire circuit board in the thickness direction. Accordingly, a through hole may be easily formed to the circuit board in such a way as to penetrate the first insulating layer and the second insulating layer. The degree of freedom regarding the circuit configuration of the multi-layer circuit board may be increased by connecting a plurality of wiring patterns on different layers of the circuit board by the through hole, or by inserting the lead terminal of an electronic component in the through hole and soldering the same, for example. Also, the circuit board may be easily cut into a predetermined size (outer shape).

With the circuit board in one or more embodiments of the disclosure, a thickness of the first insulating layer is desirably thinner than a thickness of the second insulating layer.

Also, with the circuit board in one or more embodiments of the disclosure, the thermal conductivity of the thermal conductor is desirably higher than the thermal conductivity of the first insulating layer.

Also, with the circuit board in one or more embodiments of the disclosure, the thermal conductor may be provided over a wide range so as to overlap with a plurality of the mounting regions provided on the upper surface of the first insulating layer.

Furthermore, with the circuit board in one or more embodiments of the disclosure, the second insulating layer may have a laminate structure, and a wiring pattern may be provided on both a first inner layer present between the first insulating layer and the second insulating layer, and a second inner layer present inside the second insulating layer.

Moreover, with the circuit board in one or more embodiments of the disclosure, a mounting region of an electronic component and a wiring pattern may be provided on a lower surface of the second insulating layer.

Furthermore, an electronic device according to one or more embodiments of the disclosure includes the circuit board described above, an electronic component that is mounted on a mounting region provided to the circuit board and that generates heat, and a heat radiator that is provided so as to contact a lower surface of a thermal conductor provided to the circuit board.

With the electronic device in one or more embodiments of the disclosure, the heat radiator is desirably separated from a conductor or an electronic component that is mounted on a lower surface of a second insulating layer provided to the circuit board.

With the electronic device in one or more embodiments of the disclosure, an area of a surface of each of the thermal conductor and the heat radiator facing a first insulating layer provided to the circuit board may be larger than an area of a mounting region provided to the first insulating layer. Also, a penetration hole penetrating the first insulating layer and the thermal conductor may be provided at a non-overlapping position, of the first insulating layer, not overlapping the mounting region and the wiring pattern, and a screw hole may be provided to the heat radiator in such a way as to communicate with the penetration hole, and by causing a screw member to penetrate the penetration hole from above the first insulating layer and to be screwed with the screw hole, the heat radiator may be fixed to the lower surface of the thermal conductor.

According to one or more embodiments of the disclosure, it is possible to facilitate mounting of an electronic component on a circuit board, to efficiently radiate heat that is generated by the electronic component, and to allow a through hole to be easily formed to the circuit board.

BRIEF DESCRIPTION OF THE DRAWINGS

FIG. 5B is a diagram showing subsequent steps of the manufacturing steps in FIG. 5A;

DETAILED DESCRIPTION

Figure 1:
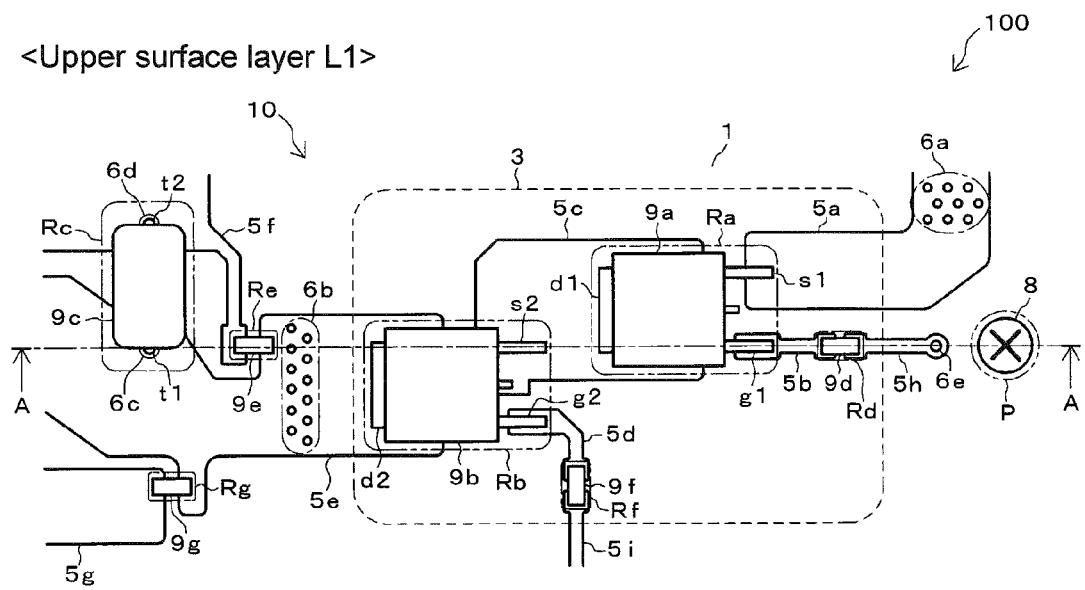
FIG. 1 is a diagram showing an upper surface layer on the upper surface of a circuit board according to a first embodiment of the disclosure.

Embodiments of the disclosure will be described with reference to the drawings. In the drawings, the identical or equivalent component is designated by the identical numeral. In embodiments of the disclosure, numerous specific details are set forth in order to provide a more through understanding of the invention. However, it will be apparent to one of ordinary skill in the art that the invention may be practiced without these specific details. In other instances, well-known features have not been described in detail to avoid obscuring the invention.

First, the structures of a circuit board 10 and an electronic device 100 according to a first embodiment will be described with reference to FIGS. 1 to 4.

Figure 2:
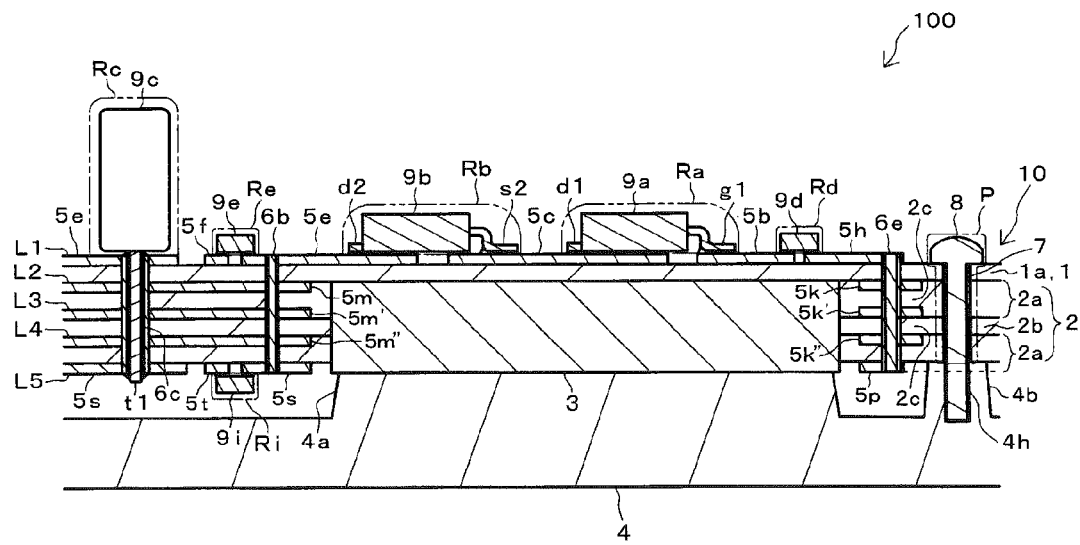
FIG. 2 is a diagram showing a cross section along A-A in FIG. 1.
Figure 3:
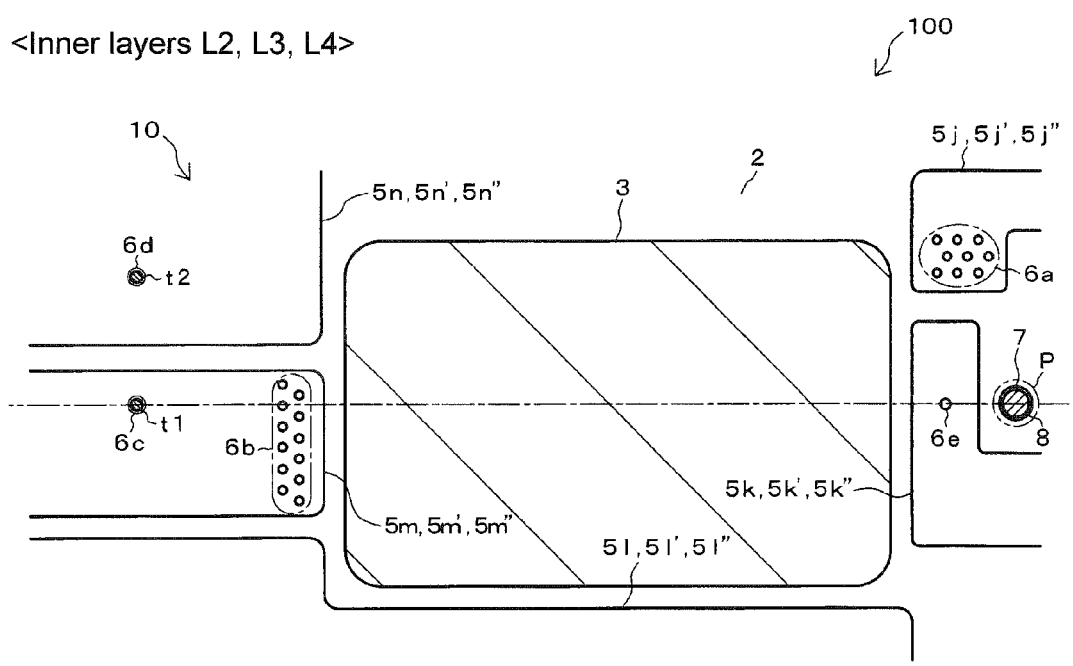
FIG. 3 is a diagram showing an inner layer inside the circuit board in FIG. 1.
Figure 4:
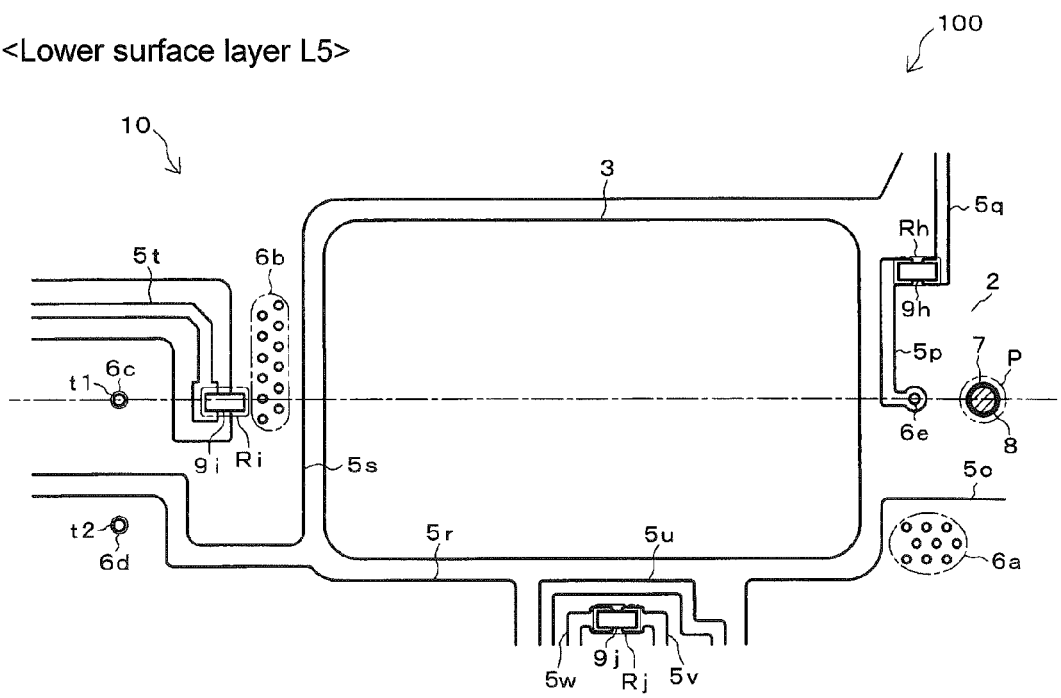
FIG. 4 is a diagram showing a lower surface layer on the lower surface of the circuit board in FIG. 1.

FIG. 1 is a diagram showing an upper surface layer L1 on the upper surface of the circuit board 10 according to the first embodiment. FIG. 2 is a diagram showing a cross section along A-A in FIG. 1. FIG. 3 is a diagram showing inner layers L2, L3 and L4 inside the circuit board 10. FIG. 4 is a diagram showing a lower surface layer L5 on the lower surface of the circuit board 10. Additionally, FIGS. 1 and 3 show a state where the circuit board 10 is seen from above, and FIG. 4 shows a state where the circuit board 10 is seen from below. Also, in each of the drawings, the circuit board 10 and the electronic device 100 are only partially shown for the sake of convenience.

For example, the electronic device 100 is configured by a DC-DC converter that is mounted on an electric vehicle or a hybrid vehicle. The electronic device 100 is configured from the circuit board 10, electronic components 9a to 9j, and a heat sink 4.

As shown in FIG. 2, the circuit board 10 is a multi-layer board provided with surface layers L1 and L5 on the upper and lower surfaces, respectively, and with a plurality of inner layers L2, L3 and L4 inside. The circuit board 10 is provided with a first insulating layer 1, a second insulating layer 2, a metal core 3, the heat sink 4, wiring patterns 5a to 5w (see FIG. 4), through holes 6a to 6e, and the like.

The first insulating layer 1 is configured by a high thermal conductivity prepreg. A high thermal conductivity prepreg is a prepreg having a high thermal conductivity and insulation properties that is made by impregnating alumina into epoxy, for example. The first insulating layer 1 is formed into a flat plate shape having a predetermined thickness (about 100 μm). The upper surface layer L1 is formed on the upper surface, of the first insulating layer 1, that is exposed to the outside. As shown in FIG. 1, mounting regions Ra to Rg of the electronic components 9a to 9g, and the wiring patterns 5a to 5i are provided on the upper surface layer L1.

The wiring patterns 5a to 5i are each made of a copper foil having an electrical conductivity and a thermal conductivity. Parts of the wiring patterns 5a to 5i function as lands for soldering the electronic components 9a to 9g.

Field-effect transistors (FETs) 9a and 9b are mounted on the mounting regions Ra and Rb, respectively. A discrete component 9c is mounted on the mounting region Rc. Chip capacitors 9d to 9g are mounted on the mounting regions Rd to Rg, respectively.

The FETs 9a and 9b are surface-mounted electronic components that generate a large amount of heat. A source terminal s1 of the FET 9a is soldered to the wiring pattern 5a. A gate terminal g1 of the FET 9a is soldered to the wiring pattern 5b. A drain terminal d1 of the FET 9a is soldered to the wiring pattern 5c. A source terminal s2 of the FET 9b is soldered to the wiring pattern 5c. A gate terminal g2 of the FET 9b is soldered to the wiring pattern 5d. A drain terminal d2 of the FET 9b is soldered to the wiring pattern 5e.

As shown in FIG. 2, the discrete component 9c is an electronic component that is provided with lead terminals t1 and t2 (FIG. 1) that penetrate the circuit board 10. The main body of the discrete component 9c is mounted on the upper surface of the first insulating layer 1. The lead terminals t1 and t2 of the discrete component 9c are soldered after being inserted into the through holes 6c and 6d, respectively.

The chip capacitors 9d to 9g are surface-mounted electronic components. As shown in FIG. 1, the chip capacitor 9d is soldered to the wiring patterns 5b and 5h. The chip capacitor 9e is soldered to the wiring patterns 5e and 5f. The chip capacitor 9f is soldered to the wiring patterns 5d and 5i. The chip capacitor 9g is soldered to the wiring patterns 5e and 5g.

As shown in FIG. 2, the metal core 3 is provided on the lower surface of the first insulating layer 1 in a manner vertically overlapping with at least the mounting regions Ra and Rb of the FETs 9a and 9b. More specifically, as shown in FIG. 1, when seen from above the circuit board 10, the metal core 3 is provided over a wide range so as to wholly or partially overlap, in the surface direction, a plurality of mounting regions Ra, Rb, Rd and Rf and a plurality of wiring patterns 5a to 5e, 5h and 5i provided on the upper surface of the first insulating layer 1.

The metal core 3 is made of a metal plate having an electrical conductivity and a thermal conductivity, such as copper. As shown in FIGS. 1 and 4, when seen from above or below, the metal core 3 is rectangular, and is formed to be smaller than the circuit board 10. As shown in FIG. 2, the upper surface of the metal core 3 is covered by the first insulating layer 1. The metal core 3 is an example of a "thermal conductor" in one or more embodiments of the disclosure.

The second insulating layer 2 is provided on the lower surface of the first insulating layer 1, around (on the entire lateral side of) the metal core 3. The lower surface of the metal core 3 is exposed from the second insulating layer 2.

The second insulating layer 2 is configured by adhering a copper-clad laminate 2a on both the upper and lower surfaces of a normal prepreg 2b impregnated with synthetic resin. A normal prepreg 2b is a prepreg as a material of a general printed circuit board. The copper-clad laminate 2a is a plate member made of synthetic resin such as epoxy including glass fiber having copper foils attached to both the upper and lower surfaces. Accordingly, the second insulating layer 2 is formed into a flat plate shape that is thicker than the first insulating layer 1, and has a laminate structure.

Also, the second insulating layer 2 includes two types of insulating portions, the normal prepreg 2b and cores (of synthetic resin) 2c of the copper-clad laminates 2a. The materials of the insulating portions 2b and 2c are different, and the thicknesses of the insulating portions 2b and 2c are the same as the thickness of the first insulating layer 1.

The thermal conductivities of the first insulating layer 1 and the metal core 3 are higher than the thermal conductivity of the second insulating layer 2. Also, the thermal conductivity of the metal core 3 is higher than the thermal conductivity of the first insulating layer 1. Specifically, for example, whereas the thermal conductivity of the second insulating layer 2 is 0.3 W/mK to 0.5 W/mK (mK: meter-Kelvin), the thermal conductivity of the first insulating layer 1 is 3 W/mK to 5 W/mK. Also, in the case where the metal core 3 is made of copper, the thermal conductivity of the metal core 3 is about 400 W/mK.

By configuring the first insulating layer 1 by a high thermal conductivity prepreg impregnated with alumina or the like, and by configuring the second insulating layer 2 from the normal prepreg 2b and the copper-clad laminates 2a, the hardness of the first insulating layer 1 is made higher than the hardness of the second insulating layer 2.

The inner layer L2 is provided between the first insulating layer 1 and the second insulating layer 2, the inner layers L3 and L4 are provided inside the second insulating layer 2, and the lower surface layer L5 is provided on the lower surface of the second insulating layer 2 by using the copper foil portions of the copper-clad laminates 2a of the second insulating layer 2.

As shown in FIG. 3, wiring patterns 5*j* to 5*n*, 5*j*' to 5*n*', and 5*j*" to 5*n*" are provided on the inner layers L2 to L4. Each of the wiring patterns 5*j* to 5*n*, 5*j*' to 5*n*', and 5*j*" to 5*n*" is made of a copper foil having an electrical conductivity and a thermal conductivity.

In the present example, the wiring patterns 5*j*, 5*k*, 5*l*, 5*m* and 5*n* of the inner layer L2, the wiring patterns 5*j*', 5*k*', 5*l*', 5*m*' and 5*n*' of the inner layer L3, and the wiring patterns 5*j*", 5*k*", 5*l*", 5*m*" and 5*n*" of the inner layer L4 have the same shapes, respectively. In another example, the shapes of the wiring patterns of the inner layers L2, L3 and L4 may be made different.

With each of the inner layers L2 to L4, the prepreg of the second insulating layer 2 is present between the metal core 3 and the wiring patterns 5*j* to 5*n*, 5*j*' to 5*n*', or 5*j*" to 5*n*". The metal core 3 and the wiring patterns 5*j*-5*n*, 5*j*' to 5*n*', or 5*j*" to 5*n*" are insulated. The inner layer L2 is an example of a "first inner layer" in one or more embodiments of the disclosure, and the inner layers L3 and L4 are examples of a "second inner layer" in one or more embodiments of the disclosure.

As shown in FIG. 4, mounting regions Rh to Rj of electronic components 9*h* to 9*j*, and wiring patterns 5*o* to 5*w* are provided on the lower surface layer L5. The wiring patterns 5*o* to 5*w* are made of copper foils having an electrical conductivity and a thermal conductivity. Parts of the wiring patterns 5*p*, 5*q*, 5*s*, 5*t*, 5*v* and 5*w* function as lands for soldering the electronic components 9*h* to 9*j*.

The electronic components 9*h* to 9*j* are surface-mounted chip capacitors. The chip capacitor 9*h* is soldered to the wiring patterns 5*p* and 5*q*. The chip capacitor 9*i* is soldered to the wiring patterns 5*t* and 5*s*. The chip capacitor 9*j* is soldered to the wiring patterns 5*v* and 5*w*. The prepreg of the second insulating layer 2 is present between the metal core 3 and the wiring patterns 5*o*, 5*p*, 5*r*, 5*s* and 5*u* present near the metal core 3. The metal core 3 and each of the wiring patterns 5*o* to 5*w* are insulated.

The through holes 6*a* to 6*e*, which are through conductors, penetrate the first insulating layer 1, the second insulating layer 2, and the wiring patterns of both the insulating layers 1 and 2 (FIG. 2). The inner surface of each of the through holes 6*a* to 6*e* is plated with copper or solder. The through holes 6*a* to 6*e* connect the wiring patterns on different layers L1 to L5.

More specifically, a plurality of through holes 6*a* are provided in such a way as to penetrate the insulating layers 1 and 2, the wiring pattern 5*a* of the upper surface layer L1, the wiring patterns 5*j*, 5*j*' and 5*j*" of the inner layers L2 to L4, and the wiring pattern 5*o* of the lower surface layer L5. Each through hole 6*a* connects the wiring patterns 5*a*, 5*j*, 5*j*', 5*j*" and 5*o*.

A plurality of through holes 6*b* are provided in such a way as to penetrate the insulating layers 1 and 2, the wiring pattern 5*e* of the upper surface layer L1, the wiring patterns 5*m*, 5*m*' and 5*m*" of the inner layers L2 to L4, and the wiring pattern 5*s* of the lower surface layer L5. Each through hole 6*b* connects the wiring patterns 5*e*, 5*m*, 5*m*', 5*m*" and 5*s*.

The through hole 6*c* is provided in such a way as to penetrate the insulating layers 1 and 2, the wiring pattern 5*e* of the upper surface layer L1, the wiring patterns 5*m*, 5*m*' and 5*m*" of the inner layers L2 to L4, and the wiring pattern 5*s* of the lower surface layer L5. One of the lead terminals t1 of the discrete component 9*c* is soldered to the through hole 6*c*, and the through hole 6*c* connects the lead terminal t1 and the wiring patterns 5*e*, 5*m*, 5*m*', 5*m*" and 5*s*.

The through hole 6*d* is provided in such a way as to penetrate the insulating layers 1 and 2, the wiring pattern 5*f* of the upper surface layer L1, the wiring patterns 5*n*, 5*n*' and 5*n*" of the inner layers L2 to L4, and the wiring pattern 5*r* of the lower surface layer L5. The other lead terminal t2 of the discrete component 9*c* is soldered to the through hole 6*d*, and the through hole 6*d* connects the lead terminal t2 and the wiring patterns 5*f*, 5*n*, 5*n*', 5*n*" and 5*r*.

The through hole 6*e* is provided in such a way as to penetrate the insulating layers 1 and 2, the wiring pattern 5*h* of the upper surface layer L1, the wiring patterns 5*k*, 5*k*' and 5*k*" of the inner layers L2 to L4, and the wiring pattern 5*p* of the lower surface layer L5. The through hole 6*e* connects the wiring patterns 5*h*, 5*k*, 5*k*', 5*k*" and 5*p*.

As shown in FIG. 2, the heat sink 4 is provided below the second insulating layer 2 and the metal core 3. The heat sink 4 is made of metal such as aluminum, and cools the circuit board 10 by radiating heat generated at the circuit board 10 to outside. The heat sink 4 is an example of a "heat radiator" in one or more embodiments of the disclosure.

Protrusions 4*a* and 4*b* protruding upward are formed on the upper surface of the heat sink 4. The upper surfaces of the protrusions 4*a* and 4*b* are in parallel with the board surface of the circuit board 10.

A screw hole 4*h* is formed to the protrusion 4*b* of the heat sink 4, in parallel with the thickness direction (vertical direction in FIG. 2) of the circuit board 10. At each of the insulating layers 1 and 2, a penetration hole 7 is provided at a non-overlapping position P not overlapping the mounting regions Ra to Rj and the wiring patterns 5*a* to 5*w*. The penetration hole 7 is communicated with the screw hole 4*h* of the heat sink 4.

By causing a screw 8 to penetrate the penetration hole 7 from above the first insulating layer 1 and to be screwed with the screw hole 4*h* of the heat sink 4, the protrusion 4*b* of the heat sink 4 is fixed to the lower surface of the second insulating layer 2, as shown in FIG. 2. By providing a plurality of such screw fastening parts, the heat sink 4 is attached below the circuit board 10. The screw 8 is an example of a "screw member" in one or more embodiments of the disclosure.

The lower surface of the metal core 3 and the upper surface of the protrusion 4*a* of the heat sink 4 contact each other in a state where the protrusion 4*b* of the heat sink 4 is fixed to the lower surface of the second insulating layer 2. In the present example, the area of the upper surface of the protrusion 4*a* of the heat sink 4 is made slightly smaller than the area of the lower surface of the metal core 3 for the purpose of securing a predetermined insulation distance between the metal core 3 and the wiring patterns 5*o*, 5*p*, 5*r*, 5*s* and 5*u* of the lower surface layer L5, for example.

In another example, by giving consideration to the arrangements of the electronic components and the wiring patterns of the lower surface layer L5, the area of the upper surface of the protrusion 4*a* of the heat sink 4 may be made the same or slightly larger than the area of the lower surface of the metal core 3.

A thermal grease (not shown) having a high thermal conductivity is applied on the upper surface of the protrusion 4*a* of the heat sink 4. The adhesion between the upper surface of the protrusion 4*a* and the lower surface of the metal core 3 is thereby increased, and the thermal conductivity from the metal core 3 to the heat sink 4 is increased.

Next, a manufacturing method of the circuit board 10 will be described with reference to FIGS. 5A, 5B and 6.

Figure 5A:
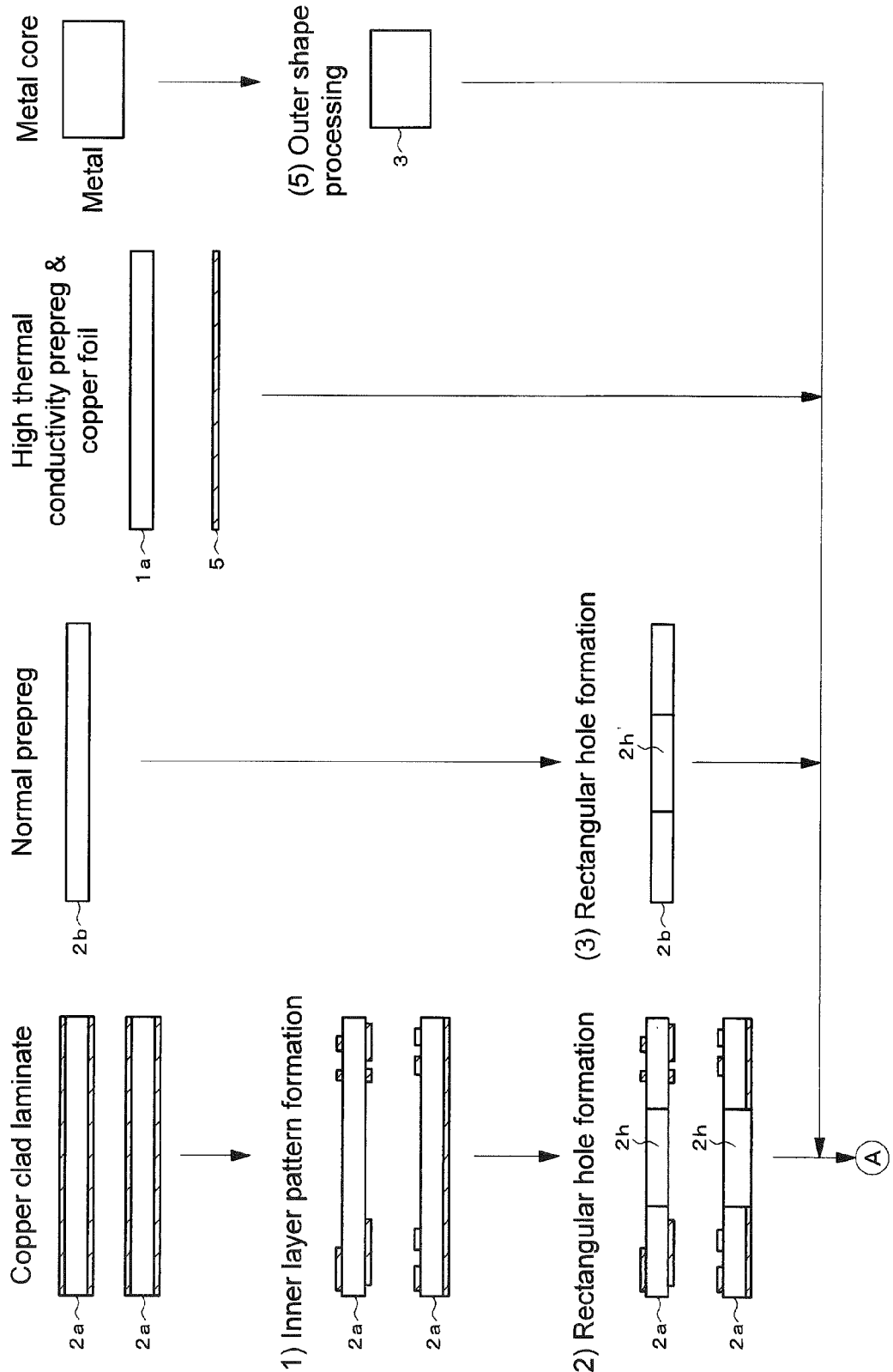
FIG. 5A is a diagram showing manufacturing steps of the circuit board in FIG. 1.

FIGS. 5A and 5B are diagrams showing manufacturing steps of the circuit board 10. FIG. 6 is a diagram showing a part of the manufacturing steps in FIG. 5A. Additionally, in FIGS. 5A, 5B and 6, each part of the circuit board 10 is shown in a simplified manner.

In FIG. 5A, an etching treatment or the like is applied to the copper foils on the upper and lower surfaces of one of the two copper-clad laminates 2a, and the wiring patterns 5j to 5n and 5j' to 5n' (the reference signs are omitted in FIGS. 5A and 5B) of the inner layers L2 and L3 are formed. Also, an etching treatment or the like is applied to the copper foil on the upper surface of the other copper-clad laminate 2a, and the wiring patterns 5j'' to 5n'' (the reference signs are omitted in FIGS. 5A and 5B) of the inner layer L4 are formed ((1) in FIG. 5A).

Next, a rectangular hole 2h for fitting the metal core 3 is formed to each copper-clad laminate 2a ((2) in FIG. 5A). Also, a rectangular hole 2h' for fitting the metal core 3 is formed to the normal prepreg 2b ((3) in FIG. 5A).

Figure 6:
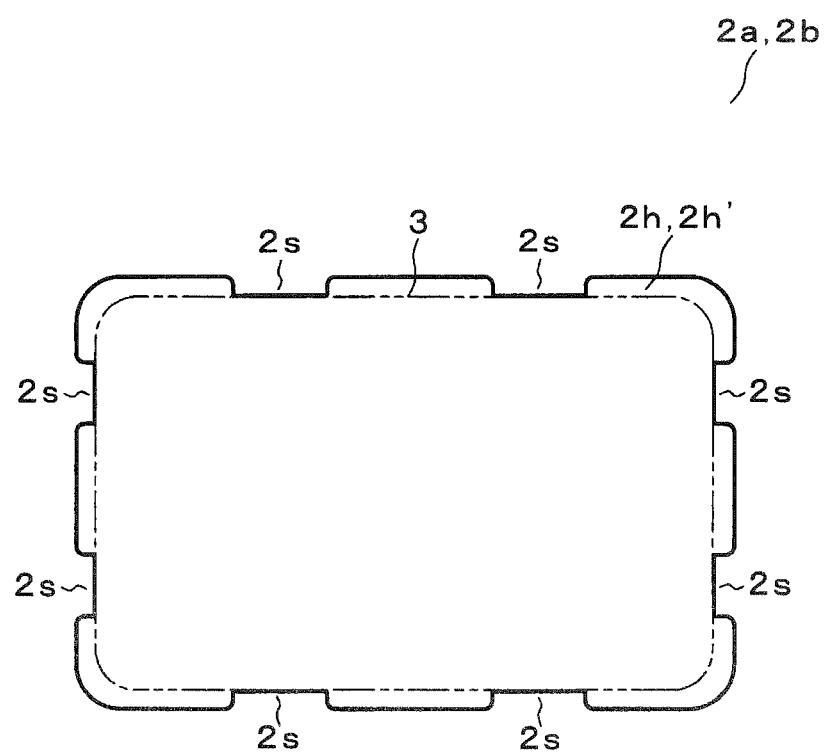
FIG. 6 is a diagram showing a part of the manufacturing steps in FIG. 5A.

Additionally, as shown in FIG. 6, when forming the rectangular holes 2h and 2h' to the copper-clad laminates 2a and the normal prepreg 2b, a plurality of ledges 2s protruding inward may be formed on the inner surfaces of the rectangular holes 2h and 2h' at a predetermined intervals. In this case, the length of each ledge 2s is such that the outer surface of the metal core 3 is almost reached in a state where the metal core 3 is fitted in the rectangular hole 2h or 2h'. The contact areas between the metal core 3 and the side walls of the rectangular holes 2h and 2h' are thereby made small, and fitting of the metal core 3 into the rectangular holes 2h and 2h' is facilitated.

Furthermore, a high thermal conductivity prepreg 1a having a predetermined thickness and a copper foil 5 to be attached to the upper surface of the prepreg 1a, the copper foil 5 having a predetermined thickness, are prepared ((4) in FIG. 5A). Moreover, a metal core 3 having a predetermined shape is formed by processing a metal plate of copper or the like ((5) in FIG. 5A).

Then, one of the copper-clad laminates 2a, the normal prepreg 2b, and the other of the copper-clad laminates 2a are stacked in this order from below, and the metal core 3 is fitted into the rectangular holes 2h and 2h'. Furthermore, the high thermal conductivity prepreg 1a and the copper foil 5 are stacked in this order above the afore-mentioned stack, and the stack is pressure bonded in the vertical direction (the thickness direction of each member) by applying heat ((6) in FIG. 5B). The synthetic resins of the prepregs 2b and 1a are melted and enter the gaps between the members, and the members are adhered together, and the second insulating layer 2, the first insulating layer 1, and the inner layers L2 to L4 are formed ((6') in FIG. 5B).

Next, holes are opened with a drill or the like at predetermined parts, and the inner surfaces of the holes are plated, and the through holes 6a to 6e (parts shown by the reference sign 6 in FIG. 5B) are formed ((7) in FIG. 5B). Next, an etching treatment or the like is applied to the copper foil 5 on the uppermost part, and the wiring patterns 5a to 5i (reference sign is omitted in FIG. 5B) of the upper surface layer L1 are formed on the upper surface of the first insulating layer 1. Also, an etching treatment or the like is applied to the copper foil on the lowermost part, and the wiring patterns 5o to 5w (reference sign is omitted in FIG. 5B) of the lower surface layer L5 are formed on the lower surface of the second insulating layer 2 ((8) in FIG. 5B). The mounting regions Ra to Rj (FIGS. 1 and 4) of the electronic components are also provided at this time on both surface layers L1 and L5.

Then, a surface treatment such as resist printing or silk screen printing is applied to the upper surface of the first insulating layer 1, the wiring patterns 5a to 5i, the lower surface of the second insulating layer 2, the wiring patterns 5o to 5w and the like that are exposed ((9) in FIG. 5B). Then, unnecessary edges of the insulating layers 1 and 2 are cut, for example, and the outer shape is processed ((10) in FIG. 5B). The circuit board 10 is thereby formed.

According to the first embodiment described above, the first insulating layer 1 is provided on the upper surfaces of the metal core 3 and the second insulating layer 2, and thus one or more of the electronic components 9a, 9b, 9d and 9f may be easily mounted above the metal core 3 while being insulated from the metal core 3. Also, the wiring patterns 5a to 5e, 5h and 5i may be easily formed above the metal core 3 while being insulated from the metal core 3. An electrical circuit may thereby be easily formed on the upper surface of the circuit board 10, and the mounting density of the circuit board 10 may be increased.

Furthermore, the thermal conductivity of the first insulating layer 1 is higher than the thermal conductivity of the second insulating layer 2, and the thermal conductivity of the metal core 3 is higher than the thermal conductivity of the first insulating layer 1. Accordingly, heat generated by the electronic components 9a, 9b, 9d and 9f that are mounted above the metal core 3 may be easily transferred to the metal core 3 via the first insulating layer 1. Moreover, the heat is transferred from the lower surface of the metal core 3 that is exposed from the second insulating layer 2 to the heat sink 4 that is in contact, and the heat may be efficiently radiated from the heat sink 4 to outside.

Furthermore, by making the materials of the first insulating layer 1 and the second insulating layer 2 different, and by making the thermal conductivity of the first insulating layer 1 higher than the thermal conductivity of the second insulating layer 2, even if the hardness of the first insulating layer 1 is higher than the hardness of the second insulating layer 2, only the first insulating layer 1 at the top is hardened, not the entire circuit board 10 in the thickness direction. Accordingly, the through holes 6a to 6e may be easily formed to the circuit board 10 in such a way as to penetrate the first insulating layer 1 and the second insulating layer 2. The degree of freedom regarding the circuit configuration of the multi-layer circuit board 10 may be increased by connecting a plurality of wiring patterns on the different layers L1 to L5 of the circuit board 10 by the through holes 6a to 6e, or by inserting the lead terminals t1 and t2 of the discrete component 9c in the through holes 6c and 6d and soldering the same, for example. Also, the circuit board 10 may be easily cut into a predetermined size (outer shape).

Furthermore, in the first embodiment described above, the thickness of the first insulating layer 1, which is the harder of the insulating layers 1 and 2, is made thinner than the thickness of the second insulating layer 2, which is the softer of the two. Accordingly, the through holes 6a to 6e may be easily formed by easily forming the holes with a drill or the like in such a way as to penetrate the first insulating layer 1 and the second insulating layer 2.

Also, in the first embodiment described above, the metal core 3 is provided over a wide range so as to overlap with a plurality of mounting regions Ra, Rb, Rd and Rf provided on the upper surface of the first insulating layer 1. Accordingly, a plurality of electronic components 9a, 9b, 9d and 9f may be easily mounted above the metal core 3 while being insulated from the metal core 3, and also a plurality of wiring patterns 5a to 5e, 5h and 5i may be easily formed. Moreover, heat generated by the plurality of electronic components 9a, 9b, 9d and 9f mounted above the metal core 3 may be transferred to the heat sink 4 via the first insulating layer 1 and the metal core 3, and may be efficiently and collectively radiated.

Moreover, in the first embodiment described above, the wiring patterns 5j to 5n, 5j' to 5n', and 5j" to 5n" are formed, respectively, to the inner layer L2 between the first insulating layer 1 and the second insulating layer 2, and the inner layers L3 and L4 inside the second insulating layer 2. Accordingly, heat generated by the electronic components 9a to 9g mounted on the upper surface of the first insulating layer 1 may be spread across the entire circuit board 10 by the wiring patterns 5j to 5n, 5j' to 5n', and 5j" to 5n" of the inner layers L2 to L4 after being transferred to the first insulating layer 1 and the metal core 3.

Furthermore, in the first embodiment described above, the mounting regions Rh to Rj of the electronic components 9h to 9j and the wiring patterns 5o to 5w are provided on the lower surface of the second insulating layer 2. Accordingly, heat generated by the electronic components 9a to 9g on the upper surface and spread across the entire circuit board 10, and heat generated by the electronic components 9h to 9j on the lower surface may be radiated below the circuit board 10. Also, an electrical circuit may be easily formed on the lower surface of the circuit board 10, and the mounting density of the circuit board 10 may be further increased.

Furthermore, in the first embodiment described above, the wiring patterns 5a, 5e, 5f, 5h, 5j, 5k, 5m, 5n, 5j', 5k', 5m', 5n', 5j", 5k", 5m", 5n", 5o, 5p, 5r and 5s provided on the upper surface of the first insulating layer 1, and inside and on the lower surface of the second insulating layer 2 are connected by the through holes 6a to 6e. Accordingly, heat generated by the electronic components 9a to 9g on the upper surface of the circuit board 10 and transferred to the wiring patterns 5a, 5e, 5f and 5h may be transferred to the wiring patterns 5j, 5k, 5m, 5n, 5j', 5k', 5m', 5n', 5j", 5k", 5m" and 5n" on the inside via the through holes 6a to 6e, and be spread across the entire circuit board 10. Moreover, the heat may also be transferred to the wiring patterns 5o, 5p, 5r and 5s on the lower surface, and be radiated below or be radiated via the metal core 3 and the heat sink 4.

Moreover, in the first embodiment described above, the heat sink 4 is separated from the electronic components 9h to 9j and the wiring patterns 5o to 5w mounted on the lower surface of the second insulating layer 2. Accordingly, the electronic components 9a to 9j, and the wiring patterns 5a to 5w mounted on the circuit board 10 may be prevented from being electrically connected by the heat sink 4 in an undesigned way, and an electrical circuit may be reliably formed.

Next, structures of a circuit board 10' and an electronic device 100 according to a second embodiment will be described with reference to FIGS. 7 and 8.

Figure 7:
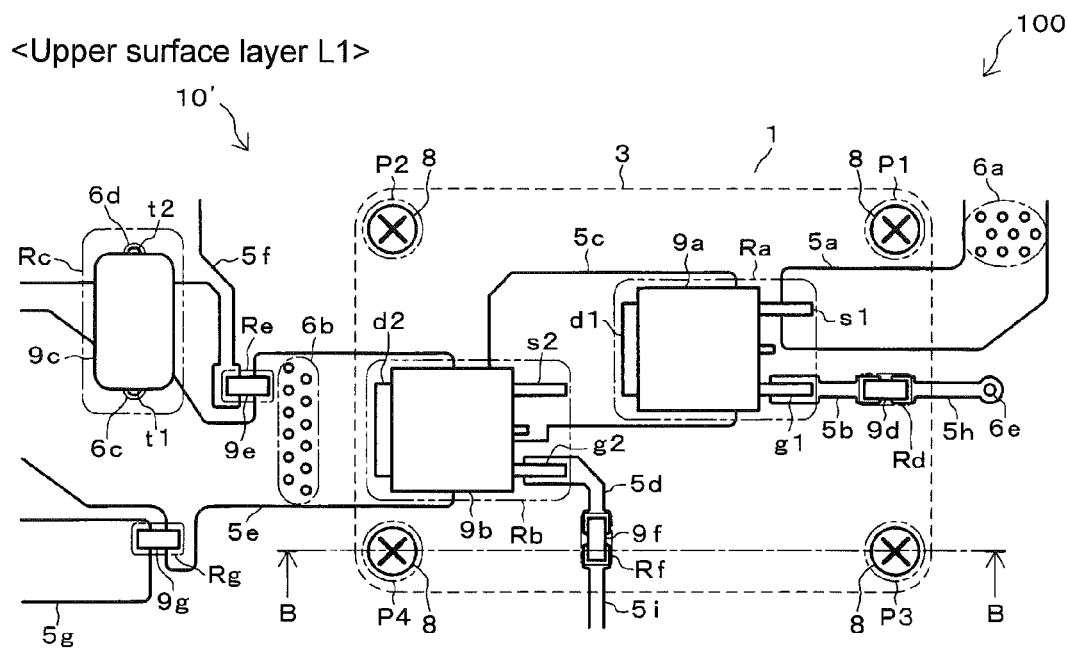
FIG. 7 is a diagram showing an upper surface layer on the upper surface of a circuit board according to a second embodiment of the disclosure.

FIG. 7 is a diagram showing an upper surface layer L1 on the upper surface of the circuit board 10' according to the second embodiment. FIG. 8 is a diagram showing a cross section along B-B in FIG. 7. Also, in each of the drawings, the circuit board 10' and the electronic device 100 are only partially shown for the sake of convenience. Additionally, inner layers L2 to L4 and a lower surface layer L5 of the circuit board 10' are the same as those in FIGS. 3 and 4.

Figure 8:
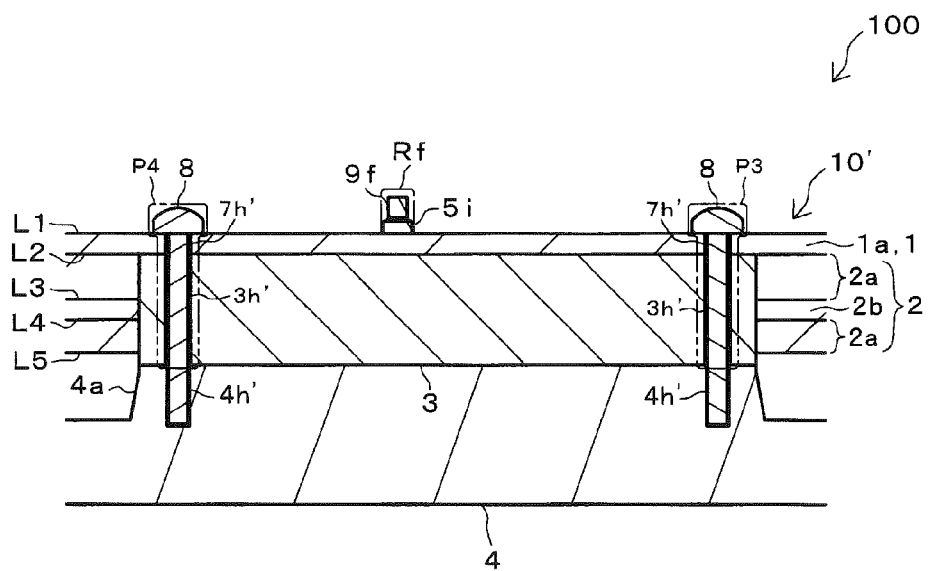
FIG. 8 is a diagram showing a cross section along B-B in FIG. 7.

As shown in FIGS. 7 and 8, with the circuit board 10' according to the second embodiment, screws 8 penetrate a metal core 3 and are screwed with a heat sink 4, thereby fixing the metal core 3 and the heat sink 4.

More specifically, the areas of the surfaces of the metal core 3 and a protrusion 4a of the heat sink 4 facing a first insulating layer 1 are larger than the total area of mounting regions Ra, Rb, Rd and Rf provided on the upper surface of the first insulating layer 1.

As shown in FIG. 7, penetration holes 7h' and 3h' (FIG. 8) are provided at non-overlapping positions P1, P2, P3 and P4, of the first insulating layer 1, not overlapping mounting regions Ra to Rg and wiring patterns 5a to 5i of the upper surface layer L1, the penetration holes 7h' and 3h' penetrating the first insulating layer 1 and the metal core 3, respectively. Also, the non-overlapping positions P1, P2, P3 and P4, and the penetration holes 7h' and 3h' are provided so as not to overlap with wiring patterns 5j to 5w and mounting regions Rh to Rj of other layers L2 to L5. Screw holes 4h' are provided to the protrusion 4a of the heat sink 4 in such a way as to communicate with the penetration holes 7h' and 3h'.

Four screws 8 penetrate the penetration holes 7h' and 3h' from above the first insulating layer 1, and are screwed with the screw holes 4h' of the heat sink 4. The protrusion 4a of the heat sink 4 is thereby fixed to the lower surface of the metal core 3, as shown in FIG. 8.

In this manner, the screws 8 may be made to penetrate the circuit board 10' from above and be screwed with the heat sink 4, and the metal core 3 and the heat sink 4 may be brought into close contact without the screws 8 interfering with the electronic components 9a to 9j and the wiring patterns 5a to 5w. Heat generated by the electronic components 9a, 9b, 9d and 9f mounted above the metal core 3 may then be efficiently transferred to the heat sink 4 via the first insulating layer 1 and the metal core 3, and the heat may be efficiently radiated from the heat sink 4.

The disclosure may adopt various embodiments other than the embodiments described above. For example, the embodiments described above illustrate examples where the through holes 6a to 6e are provided to electrically connect the wiring patterns, of the circuit board 10 or 10', that are present on the upper surface of the first insulating layer 1 and present inside and on the lower surface of the second insulating layer 2, but the disclosure is not limited to such examples. A conductor such as a copper terminal or pin may alternatively be provided in a manner penetrating the circuit board, and the wiring patterns on different layers may thereby be connected. Also, the through holes in one or more embodiments of the disclosure include not only through holes configuring the electrical wiring, but also through holes configuring heat transfer paths (so-called thermal vias), for example.

Also, the embodiments described above illustrate examples where a thermal grease is present between the metal core 3 and the heat sink 4, but a sheet having insulation properties and a thermal conductivity may alternatively be used, for example.

Furthermore, the embodiments described above illustrate examples where the shape of the metal core 3 is rectangular when seen from above, but this is not restrictive, and the shape of the metal core seen from above may take any shape according to the arranged positions and shapes of electronic components that generate heat.

Moreover, the embodiments described above illustrate examples where the heat sink 4 is used as the heat radiator, but an air-cooling or water-cooling radiator, or a radiator that uses a refrigerant may alternatively be used, for example. Also, a radiator made of a high thermal conductivity resin may also be used instead of the metal radiator.

Furthermore, the embodiments described above illustrate examples where the screw 8 is used as a screw member, but a bolt or the like may alternatively be used. Also, the radiator may be attached below the circuit board by other fasteners.

Still further, the embodiments described above illustrate examples where the disclosure is applied to the circuit board 10 or 10' provided with two surface layers L1 and L5 and three inner layers L2 to L4, but the disclosure may also be applied to a single-layer circuit board having conductors such as the wiring patterns provided only on the upper surface, or a circuit board having conductors provided on two or more layers.

Still further, the embodiments described above cites a DC-DC converter that is mounted on an electric vehicle or a hybrid vehicle as an example of the electronic device 100, but the disclosure may also be applied to other electronic devices provided with a circuit board, an electronic component that generates heat, and a radiator.

While the invention has been described with reference to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A circuit board comprising:
   a first insulating layer having an upper surface on which a first mounting region of a first electronic component and a first wiring pattern is provided;
   a thermal conductor provided, on a lower surface of the first insulating layer, in such a way as to vertically overlap with at least the first mounting region; and
   a second insulating layer provided on the lower surface of the first insulating layer, around the thermal conductor, wherein a lower surface of the thermal conductor is exposed from the second insulating layer,
   wherein thermal conductivities of the first insulating layer and the thermal conductor are higher than a thermal conductivity of the second insulating layer,
   wherein a hardness of the first insulating layer is higher than a hardness of the second insulating layer, and
   wherein the circuit board further comprises a first through hole penetrating the first insulating layer and the second insulating layer.

2. The circuit board according to claim 1, wherein a thickness of the first insulating layer is thinner than a thickness of the second insulating layer.

3. The circuit board according to claim 1, wherein the thermal conductivity of the thermal conductor is higher than the thermal conductivity of the first insulating layer.

4. The circuit board according to claim 1, wherein the first mounting region is a plurality of the first mounting regions, the thermal conductor is provided over a wide range so as to overlap with the plurality of the first mounting regions provided on the upper surface of the first insulating layer.

5. The circuit board according to claim 1, wherein the second insulating layer has a laminate structure, and wherein a second wiring pattern is provided on both a first inner layer present between the first insulating layer and the second insulating layer, and a second inner layer present inside the second insulating layer.

6. The circuit board according to claim 1, wherein a second mounting region of a second electronic component and a second wiring pattern are provided on a lower surface of the second insulating layer.

7. An electronic device comprising:
   the circuit board according to claim 1;
   the first electronic component that is mounted on the first mounting region provided to the circuit board and that generates heat; and
   a heat radiator that is provided so as to contact the lower surface of the thermal conductor provided to the circuit board.

8. The electronic device according to claim 7, wherein the heat radiator is separated from a second electronic component that is mounted on the lower surface of the second insulating layer provided to the circuit board.

9. The electronic device according to claim 7, wherein an area of a surface of each of the thermal conductor and the heat radiator facing a first insulating layer provided to the circuit board is larger than an area of the first mounting region provided to the first insulating layer, wherein a penetration hole penetrating the first insulating layer and the thermal conductor is provided at a non-overlapping position, of the first insulating layer, not overlapping the first mounting region and the first wiring pattern, and a screw hole is provided to the heat radiator in such a way as to communicate with the penetration hole, and wherein, by causing a screw member to penetrate the penetration hole from above the first insulating layer and to be screwed with the screw hole, the heat radiator is fixed to the lower surface of the thermal conductor.

* * * * *